United States Patent
Kim et al.

(10) Patent No.: US 9,257,639 B2
(45) Date of Patent: Feb. 9, 2016

(54) PHASE-CHANGE MEMORY CELLS

(71) Applicant: GLOBALFOUNDRIES INC., Grand Cayman (KY)

(72) Inventors: SangBum Kim, Yorktown Heights, NY (US); Daniel Krebs, Zurich (CH); Chung Hon Lam, Peekskill, NY (US); Charalampos Pozidis, Thalwil (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/296,570

(22) Filed: Jun. 5, 2014

(65) Prior Publication Data
US 2014/0369114 A1 Dec. 18, 2014

(30) Foreign Application Priority Data
Jun. 14, 2013 (GB) .................................. 1310630.7

(51) Int. Cl.
*G11C 11/16* (2006.01)
*H01L 45/00* (2006.01)
*G11C 13/00* (2006.01)
*G11C 11/56* (2006.01)

(52) U.S. Cl.
CPC ............ *H01L 45/06* (2013.01); *G11C 11/5678* (2013.01); *G11C 13/0004* (2013.01); *H01L 45/1246* (2013.01); *H01L 45/1253* (2013.01); *G11C 2213/15* (2013.01); *G11C 2213/52* (2013.01); *H01L 45/144* (2013.01)

(58) Field of Classification Search
CPC .............................. G11C 13/0069; G11C 11/16
USPC .................................................. 365/163, 158
See application file for complete search history.

(56) References Cited

U.S. PATENT DOCUMENTS

| | | | |
|---|---|---|---|
| 2004/0052117 A1 | 3/2004 | Jiang | |
| 2009/0130797 A1 | 5/2009 | Lee et al. | |
| 2010/0163817 A1* | 7/2010 | Savransky et al. | 257/2 |
| 2010/0283027 A1* | 11/2010 | Hosaka et al. | 257/2 |
| 2011/0037042 A1 | 2/2011 | Breitwisch et al. | |
| 2011/0121252 A1 | 5/2011 | Breitwisch et al. | |
| 2011/0127486 A1* | 6/2011 | Hosaka et al. | 257/4 |
| 2012/0147666 A1* | 6/2012 | Dubourdieu et al. | 365/163 |
| 2014/0355338 A1* | 12/2014 | Perniola | 365/163 |

FOREIGN PATENT DOCUMENTS

EP 2034536 A1 3/2009

OTHER PUBLICATIONS

Liao et al., Chalcogenide phase change induced with single-wall carbon nanotube heaters, IEEE 2009 67th Annual Device Research Conference (DRC 2009), pp. 239-240, Published Jun. 22, 2009.

* cited by examiner

*Primary Examiner* — Michael Tran
(74) *Attorney, Agent, or Firm* — Thompson Hine LLP

(57) ABSTRACT

Improved phase-change memory cells are provided for storing information in a plurality of programmable cell states. A phase-change material is located between first and second electrodes for applying a read voltage to the phase-change material to read the programmed cell state. An electrically-conductive component extends from one electrode to the other in contact with the phase-change material. The resistance presented by this component to a cell current produced by the read voltage is less than that of the amorphous phase and greater than that of the crystalline phase of the phase-change material in any of the cell states.

19 Claims, 3 Drawing Sheets

-PRIOR ART-

PHASE-CHANGE MEMORY CELLS

CROSS-REFERENCE TO RELATED APPLICATION

This application claims priority under 35 U.S.C. §119 from United Kingdom Patent Application No. 1310630.7 filed Jun. 14, 2013, the entire contents of which are incorporated herein by reference.

BACKGROUND OF THE INVENTION

The present invention relates generally to phase-change memory cells.

Phase-change memory (PCM) is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

In single-level PCM devices, each cell can be set to one of s=2 states (a "SET" state and a "RESET" state) permitting storage of one bit per cell. In the RESET state, which corresponds to a wholly amorphous state of the phase-change material, the electrical resistance of the cell is very high. By heating the phase-change material to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state on rapid cooling. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to achieve an appropriate temperature to induce the desired cell-state on cooling. Reading of PCM cells is performed using cell resistance as a metric for cell-state. An applied read voltage causes current to flow through the cell, this current being dependent on resistance of the cell. Measurement of the cell current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

A problem with phase-change memory is that the resistance of the amorphous phase exhibits undesirable attributes, such as low-frequency noise and drift. This drift causes resistance of the amorphous phase to increase in value over time. As a result, the read measurements for programmed cell states tend to change over time. This resistance drift complicates read out of the written information, potentially even destroying the information if there is a large variability in the amount of drift exhibited by different cell states so that the read measurement distributions for neighboring cell states interfere with one another. The larger the number of cell states and the closer the initial spacing between readback resistance levels, the more susceptible cells are to this problem. This presents a challenge in the development of multilevel phase-change memory efforts to achieve storage of more bits per cell for increased storage density and to reduce manufacturing cost per bit.

Currently, several techniques are used to alleviate problems associated with resistance drift. One class of techniques uses specialized read and write schemes for storage and readout of information in the memory. These techniques typically incur a penalty in write or read speed and require more complicated read/write circuitry for the memory cells. Another class of techniques makes use of coding to introduce redundancy in the stored information. This inherently reduces storage density. Another approach is disclosed in European Patent Application publication no. EP 2034536 A1 and illustrated in FIG. 1 of the accompanying drawings. This figure shows a schematic illustration of a PCM cell 1 having a volume of phase-change material 2 located between a top electrode 3 and a bottom electrode (or "heater") 4. The cell state shown represents an intermediate state in which the material 2 contains both crystalline and amorphous phases. The amorphous phase is indicated by the shaded hemispherical volume 5 above bottom electrode 4. The crystalline phase 6 occupies the remainder of the cell volume. A thin resistive region 7 provides a parallel current path between the bottom electrode 4 and the crystalline phase 6 of the phase-change material in operation. When a read voltage is applied to read the programmed cell-state, the resulting cell current flows primarily via this current path from crystalline phase 6 to bottom electrode 4, in preference to flowing through the high-resistance amorphous phase 5. The resistance of the parallel current path depends on the length "x" in the figure.

Improved phase change memory cells is desirable.

SUMMARY OF THE INVENTION

Accordingly, one aspect of the present invention is a phase-change memory cell for storing information in a plurality of programmable cell states. The phase-change memory cell includes: a phase-change material located between a first electrode and a second electrode for applying a read voltage to the phase-change material to read a programmed cell state; and an electrically-conductive component extending from the first electrode to the second electrode and in contact with the phase-change material, wherein the resistance presented by the electrically-conductive component to a cell current produced by the read voltage is less than that of the amorphous phase and greater than that of the crystalline phase of the phase-change material.

Another aspect of the present invention is a memory device that includes: a one or more of phase-change memory cells, wherein the one or more phase-change memory cells that includes a phase-change material located between a first electrode and a second electrode for applying a read voltage to the phase-change material to read a programmed cell state and an electrically-conductive component extending from the first electrode to the second electrode and in contact with the phase-change material, wherein the resistance presented by the electrically-conductive component to a cell current produced by the read voltage is less than that of the amorphous phase and greater than that of the crystalline phase of the phase-change material; and a read/write controller for reading and writing data in the memory cells.

BRIEF DESCRIPTION OF THE DRAWINGS

Preferred embodiments of the present invention are described by way of example with reference to the accompanying drawings.

DETAILED DESCRIPTION OF THE PREFERRED EMBODIMENT

An embodiment of a first aspect of the present invention provides a phase-change memory cell for storing information in a plurality of programmable cell states. The memory cell includes: a phase-change material located between first and second electrodes for applying a read voltage to the phase-change material to read the programmed cell state; and an electrically-conductive component extending from one electrode to the other in contact with the phase-change material; wherein the resistance presented by the component to a cell current produced by the read voltage is less than that of the amorphous phase and greater than that of the crystalline phase of the phase-change material in any of the cell states.

Since the electrically-conductive component extends from one electrode to the other in memory cells embodying the present invention, there is a full parallel current path between the electrodes, independent of the phase-change material. The arrangement is such that the resistance presented by the electrically-conductive component is less than that of any amorphous phase in a programmed cell state and greater than that of any crystalline phase in a programmed cell state. Hence, cell current can flow primarily through the crystalline phase in preference to the electrically-conductive component and primarily through the electrically-conductive component in preference to the amorphous phase. Cell resistance, and hence measured cell state, depends primarily on resistance of the electrically-conductive component however large the amorphous phase in the PCM volume. According to embodiments of the present invention, drift-resistant operation is available regardless of amorphous size. Cells embodying the invention thus offer valuable improvements in phase-change memory devices.

The electrically-conductive component can include a layer of electrically-conductive material. Preferably, the electrically-conductive component forms a sheath around the phase-change material. The sheath can be formed by a layer of electrically-conductive material extending substantially all the way around the phase-change material. The sheath can have a base portion disposed between the phase-change material and an electrode. Alternatively, the phase-change material can be in contact with both of the electrodes.

Embodiments of further aspects of the present invention also provide a memory device including an array of phase-change memory cells according to the first aspect of the invention and a read/write controller for reading and writing data in the memory cells.

Figure 2:
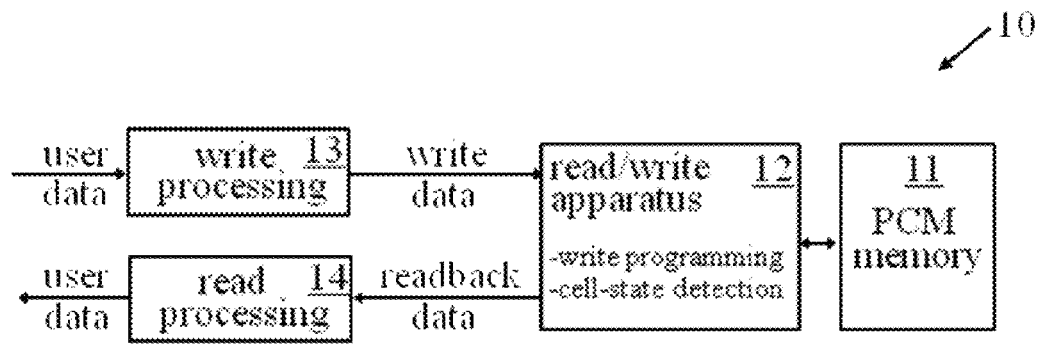
FIG. 2 is a schematic block diagram of a memory device according to an embodiment of the present invention.

FIG. 2 is a simplified schematic of a phase-change memory device according to an embodiment of the present invention. The device 10 includes multilevel phase-change memory 11 for storing data in one or more integrated arrays of PCM cells described below. Reading and writing of data to memory 11 is performed by a read/write controller 12. Controller 12 includes circuitry of a generally known form for programming PCM cells during data write operations and making read measurements for detecting cell-state during data read operations. During these operations, the read/write controller can address individual PCM cells by applying appropriate control signals to an array of word and bit lines in memory ensemble 11. As indicated by block 13 in the figure, user data input to device 10 is typically subjected to some form of write-processing, such as coding for error-correction purposes, before being supplied as write data to controller 12. Similarly, readback data output by controller 12 is generally processed by a read-processing module 14, e.g. for codeword detection and/or error correction, to recover the original input user data.

The PCM cells of memory 11 can store information in s>2 programmable cell states providing multilevel operation. As discussed earlier, the s programmable cell states correspond to different relative proportions of the amorphous and crystalline phases within the PCM material of the cell. These states include a high-resistance fully-amorphous RESET state, a low-resistance fully-crystalline SET state, and a number of intermediate states corresponding to increasing size of the amorphous phase within the otherwise crystalline PCM material. The s programmable cell-states are typically defined in controller 12 in terms of predetermined reference values, or ranges of values, of the resistance metric used for read detection. To program a cell in a write operation, controller 12 applies a voltage to the cell via the word- and bit-lines such that the resulting programming signal sets the cell to the required state. In a read operation, a (lower) read voltage is applied to the cell and the resulting cell current is measured to obtain the resistance metric. Controller 12 can then detect the programmed cell state by comparing the read metric with the aforementioned reference values.

Figure 1:
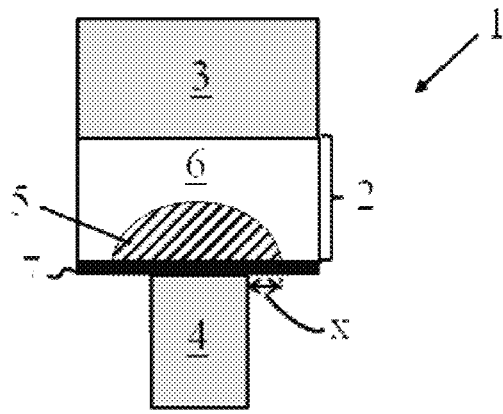
FIG. 1 shows a PCM cell according to prior art.
Figure 3:
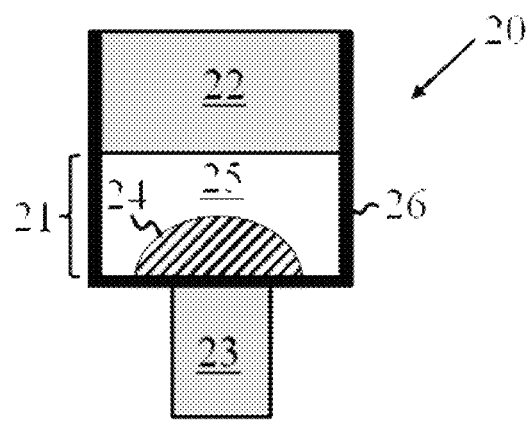
FIG. 3 shows a first PCM cell according to an embodiment of the present invention.

FIG. 3 is a schematic cross-sectional view of one embodiment of a PCM cell for use in memory 11 according to an embodiment of the present invention. The design of this cell corresponds generally to the cell structure of FIG. 1. The cell 20 has a phase-change material 21 located between first and second electrodes for connecting the cell to the word and bit lines respectively of the cell array. The two electrodes are referred to here as a "top" electrode 22 and a "bottom" electrode 23, though no limitation is implied as to cell orientation in operation. The PCM material 21 shown in the figure has an amorphous phase (indicated by region 24) and a crystalline phase (indicated by region 25). The relative proportions of these phases differ for the different programmable cell states as described earlier. Cell 20 further includes an electrically-conductive component 26 which extends from one electrode to the other in contact with the phase-change material 21. The component 26 includes a layer of electrically-conductive material on the outer surface of PCM material 21. This layer, which is shown on the left and right sides of PCM element 21 in the cross-sectional view shown, preferably extends around the PCM material on all sides thereof in the region between electrodes 22, 23. The cell 20 is typically surrounded by an insulating layer (not shown) for electrical and thermal insulation of the cell.

PCM cell 20 can be fabricated using well-known processing techniques for formation of the various cell components. In an exemplary implementation of cell 20, the PCM element 21 can include GST and electrodes 22, 23 can be formed of a metal such as TiN. The electrically-conductive layer 26 can be formed of TaN. The electrically conductive layer 21 preferably has a thickness in the range of about 1 nm to 5 nm. In general, however, the materials and dimensions of PCM material 21 and electrically conductive component 26 are selected to satisfy particular resistance requirements. Specifically, the arrangement is such that the resistance presented by component 26 to a cell current produced by the read voltage for cells is less than that of the amorphous phase 24 and greater than that of the crystalline phase 25 of the phase-change material 21 in any of the s programmable cell states defined for multilevel operation. This is explained further below with reference to FIG. 4.

Figure 4:
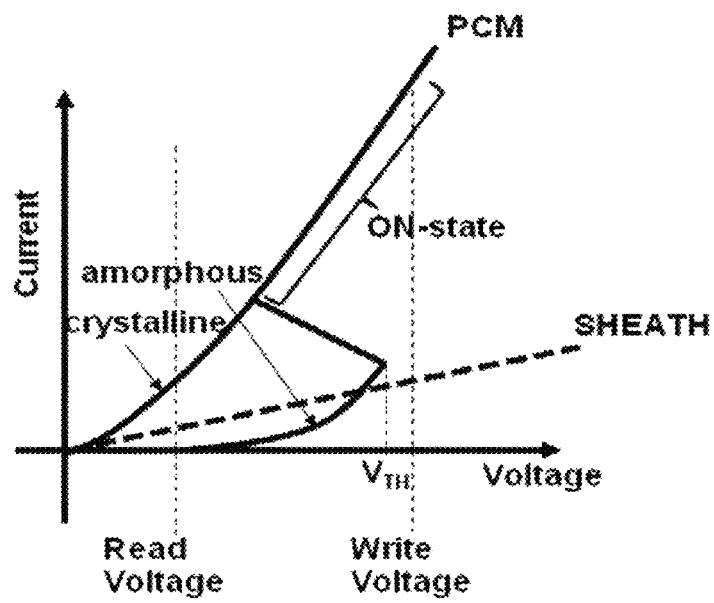
FIG. 4 indicates resistive properties of elements of the FIG. 3 cell according to an embodiment of the present invention.

FIG. 4 is a schematic illustration of the current/voltage (and hence resistance) characteristics of the material components of cell 20. The solid lines indicate variation of current with voltage for the PCM material 21, starting from the fully-crystalline SET state (upper curve) and also the fully-amorphous RESET state (lower curve). These two curves reflect the large (typically 3 orders of magnitude) variation in resistivity between the crystalline and amorphous phases. The broken line in the plot indicates the (here ohmic) characteristic for sheath 26. It can be seen that, at low voltages including the cell read voltage, the resistance of sheath 26 is between that of the amorphous and crystalline phases of PCM core 21. As a result, the cell read current flows primarily through crystalline phase 25 in preference to the sheath 26 and primarily through the sheath in preference to the amorphous phase 24. The measured cell resistance thus depends primarily on resistance of the current path through the sheath. This depends on the length of the current path which depends, in turn, on size of the amorphous phase 24 and hence on cell state. The effect of resistance drift in the amorphous phase on the measured cell resistance is significantly reduced because the cell current flows mainly through crystalline phase 25 and component 26 which do not exhibit drift. The component 26 provides a full parallel current path between electrodes 22, 23, avoiding the problem of plugging and providing drift-resistant operation regardless of amorphous size. Moreover, any residual drift effect (due to the very small current flowing through amorphous phase 24) will exhibit low variability between different cell states since the full parallel current path ensures that current through component 26 always dominates.

Referring again to FIG. 4, the amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated. At this voltage, the ON-resistance of PCM material 21 is much less than that of sheath 26. In a write operation, therefore, the cell current flows primarily through the PCM material 21. The write operation is thus substantially unaffected by presence of the sheath 26.

Based on the above principles, preferred cell arrangements are such that, at the cell read voltage, the resistance $R_{ec}$ of the electrically-conductive component is far from both the resistance $R_{amo}$ of the fully-amorphous (RESET) state and the resistance $R_{cry}$ of the fully-crystalline SET state of the PCM material (where "far" here means far within the context of the resistance range from $R_{cry}$ to $R_{amo}$). In general, an appropriate value for $R_{ec}$ in this range depends on various factors, such as the materials and dimensions of cell components, the particular characteristics of the s programmable cell states, the operating parameters (e.g. read and write voltages) of memory device 1, as well as desired performance criteria such as maximum acceptable error-rate. In general, however, the arrangement is preferably such that $R_{ec} \gg R_{cry}$ and $R_{ec} \ll R_{amo}$ within the context of the aforementioned range. As a simple example, the cell design can be such that $R_{ec}$ is at or near the middle of the resistance range from $R_{cry}$ to $R_{amo}$.

Figure 5:
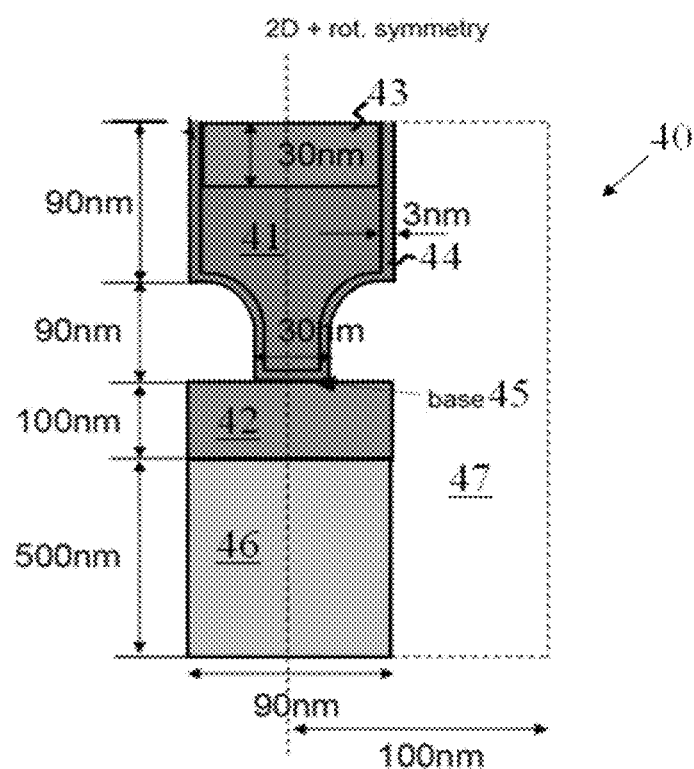
FIG. 5 shows a second PCM cell according to an embodiment of the present invention.

FIG. 5 shows a preferred cell design indicating exemplary dimensions for various elements of the cell structure according to an embodiment of the present invention. The figure shows a schematic cross-sectional view of the cell structure which has rotational symmetry about a longitudinal axis (indicated by the dashed line) in a direction between the electrodes. In this embodiment, the phase-change material has a cross-section in a plane perpendicular to the longitudinal axis, which is smaller near one electrode than the other. In particular, the portion of PCM element 41 adjacent bottom electrode 42 is narrower than the portion adjacent top electrode 43. The PCM material is GST here and electrodes 42, 43 are formed of TiN. The electrically-conductive component 44, e.g. of TaN, forms a sheath around the PCM element 41 and top electrode 43 here. The sheath 44 also has a base portion 45 disposed between the PCM material and bottom electrode 42 in this embodiment. Bottom electrode 42 is formed on a Tungsten contact 46 and the cell is surrounded by an insulating layer 47 of SiN. The presence of base 45 in this structure simplifies fabrication of the cell because removal of the base following deposition of TaN layer 44 is not required. Simulations based on this particular cell design indicate that effective cell operation is achieved with base 45 present. However, simulation results indicate that the resistance contrast between SET and RESET states can be increased and the SET voltage reduced if the base is removed.

Figure 6:
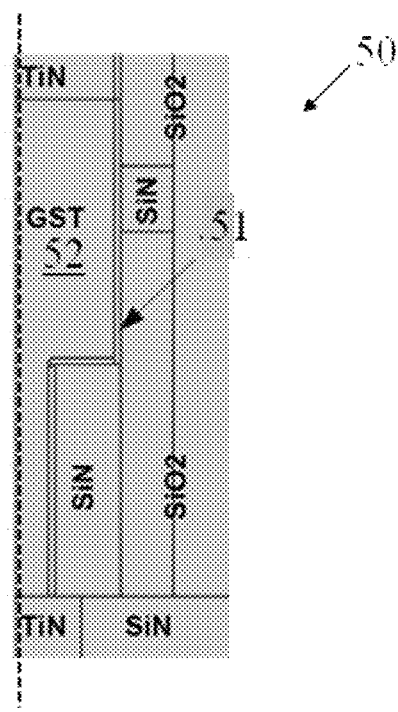
FIG. 6 shows a third PCM cell according to an embodiment of the present invention.
Figure 7:
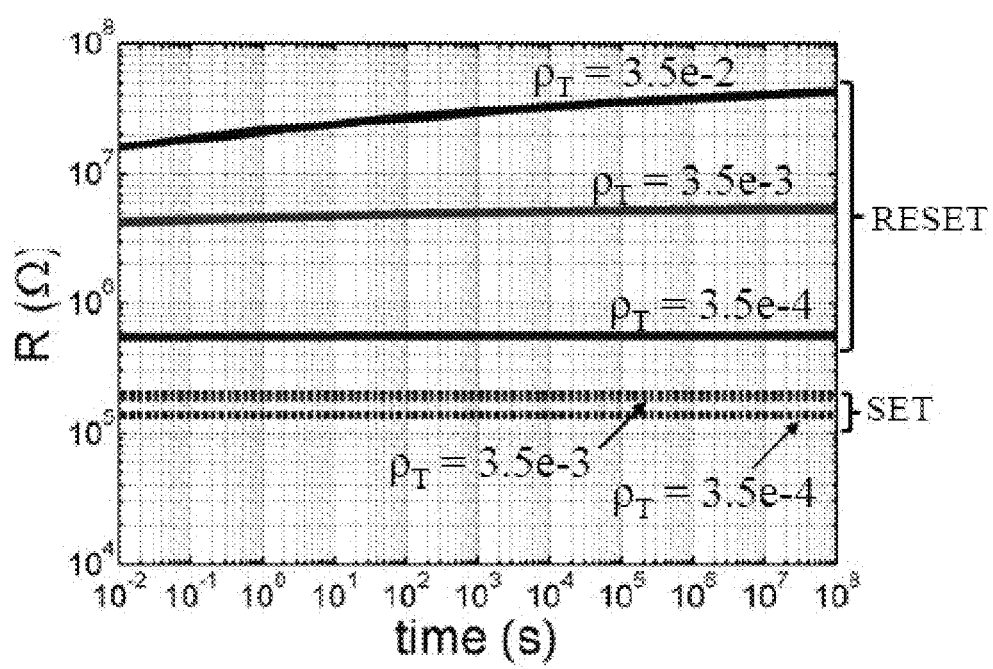
FIG. 7 indicates resistance drift for variations of the FIG. 6 embodiment according to an embodiment of the present invention.

FIG. 6 indicates a structure of a cell 50 (having rotational symmetry about the longitudinal axis shown) which is similar to the FIG. 5 cell but with a TaN sheath 51 having no base portion. The PCM element 52 is thus in contact with both of the TiN electrodes here. This structure also has SiN spacer sections between the cell structure and a surrounding SiO$_2$ insulating layer as indicated. Simulations based on this cell structure produced the results shown in FIG. 7 for the variation of cell resistance with time in both the SET and RESET states with different values of the resistivity $\rho_T$ of TaN layer 51. These results were obtained with: TaN layer thickness=1 nm; resistivity $\rho_C$ of crystalline GST=3.61e−4 Ωm; and resistivity $\rho_A$ of amorphous GST=200 $\rho_C$. The two traces at the bottom of the plot indicate time variation of the SET resistance with $\rho_T$=3.5e−4 Ωm and $\rho_T$=3.5e−3 Ωm, respectively. The top three traces indicate time variation of RESET resistance with $\rho_T$=3.5e−4 Ωm, $\rho_T$=3.5e−3 Ωm, and $\rho_T$=3.5e−2 Ωm, respectively. This figure indicates increasing resistance contrast with increasing $\rho_T$, while drift effects become more noticeable as $\rho_T$ approaches $\rho_A$. However, good, substantially drift-free operation is readily achievable. In general, therefore by selection of materials, dimensions, and cell-structure to provide resistance characteristics in accordance with the principles described above, efficient drift-resistant cell operation can be achieved.

Various modifications to the above embodiments can be envisioned. For example, other materials and dimensions giving the required functional properties and resistance characteristics can be selected for the various elements of PCM cells embodying the present invention. Alternative phase change materials include other combinations of Ge, Sb and Te, such as GeTe, or $Sb_2Te_3$, for example. In general, the electrically-conductive component can be formed of any suitable material. Examples of preferred materials include TaN, TiAlN, and doped semiconductors, preferably doped silicon. The electrodes can be formed of any convenient electrically-conductive material, typically a metallic material (e.g. a pure metal or a metal compound, alloy or other mixture) or a doped semiconductor material such as silicon or another degenerated semiconductor. In some embodiments of the present invention, the electrically-conductive component can be formed of the same material as the electrodes. Moreover, while the features described are particularly advantageous for multi-level cells, these features can also be applied to advantage in single-level cells.

Many other changes and modifications can be made to the exemplary embodiments described above without departing from the scope of the present invention.

We claim:

1. A phase-change memory cell comprising:
   a first electrode;
   a second electrode;
   a phase-change material located between the first electrode and the second electrode; and
   an electrically-conductive layer extending from the first electrode to the second electrode and in contact with the phase-change material,
   wherein the first electrode and the second electrode are configured to apply a read voltage to the phase-change material to read at least one programmed cell state, a first resistance presented by the electrically-conductive layer to a cell current produced by the read voltage is less than a second resistance of the amorphous phase and greater than a third resistance of the crystalline phase of the phase-change material, and the electrically-conductive layer forms a sheath around the phase-change material.

2. The phase-change memory cell of claim 1, wherein the electrically-conductive layer has a thickness in a range of about 1 nm to 5 nm.

3. A phase-change memory cell of claim 1, wherein the sheath has a base portion disposed between the phase-change material and the first electrode.

4. The phase-change memory cell of claim 1, wherein the phase-change material is in contact with the first electrode and with the second electrode.

5. A phase-change memory cell comprising
   a first electrode;
   a second electrode;
   a phase-change material located between the first electrode and the second electrode; and
   an electrically-conductive component extending from the first electrode to the second electrode and in contact with the phase-change material,
   wherein the first electrode and the second electrode are configured to apply a read voltage to the phase-change material to read at least one programmed cell state, a first resistance presented by the electrically-conductive component to a cell current produced by the read voltage is less than a second resistance of the amorphous phase and greater than a third resistance of the crystalline phase of the phase-change material, the phase-change material has a cross-section in a plane perpendicular to a direction from the first electrode to the second electrode, and the cross-section is smaller near the first electrode than near the second electrode.

6. The phase-change memory cell of claim 1, wherein the phase-change memory cell is configured to store information in a plurality of programmable cell states.

7. A memory device comprising:
   one or more phase-change memory cells, each of the one or more phase-change memory cells including a first electrode, a second electrode, a phase-change material located between the first electrode and the second electrode, and an electrically-conductive layer extending from the first electrode to the second electrode and in contact with the phase-change material, the first electrode and the second electrode configured to apply a read voltage to the phase-change material to read at least one programmed cell state, a first resistance presented by the electrically-conductive layer to a cell current produced by the read voltage is less than a second resistance of the amorphous phase and greater than a third resistance of the crystalline phase of the phase-change material, and the electrically-conductive layer forms a sheath around the phase-change material; and
   a read/write controller for reading and writing data in the one or more phase-change memory cells.

8. The memory device of claim 7, wherein the electrically-conductive layer has a thickness in a range of about 1 nm to 5 nm.

9. The memory device of claim 7, wherein the sheath has a base portion disposed between the phase-change material and the first electrode.

10. The memory device of claim 7, wherein the phase-change material is in contact with the first electrode and with the second electrode.

11. The memory device of claim 7, wherein the phase-change material has a cross-section in a plane perpendicular to a direction from the first electrode to the second electrode, and the cross-section is smaller near the first electrode than near the second electrode.

12. The memory device of claim 7, wherein the phase-change memory cell is configured to store information in a plurality of programmable cell states.

13. The phase-change memory cell of claim 5, wherein the electrically-conductive component is a layer of an electrically-conductive material that forms a sheath around the phase-change material.

14. The phase-change memory cell of claim 13, wherein the sheath has a base portion disposed between the phase-change material and the first electrode.

15. The phase-change memory cell of claim 13, wherein the layer has a thickness in a range of about 1 nm to 5 nm.

16. The phase-change memory cell of claim 5, wherein the phase-change material is in contact with the first electrode and with the second electrode.

17. The phase-change memory cell of claim 1, wherein the electrically-conductive layer is comprised of tantalum nitride, and the first electrode and the second electrode are comprised of titanium nitride.

18. The phase-change memory cell of claim 5, wherein the electrically-conductive layer is comprised of tantalum nitride, and the first electrode and the second electrode are comprised of titanium nitride.

19. The phase-change memory cell of claim 11, wherein the electrically-conductive layer is comprised of tantalum nitride, and the first electrode and the second electrode are comprised of titanium nitride.

* * * * *